US012700623B2

(12) United States Patent
Sasaki

(10) Patent No.: US 12,700,623 B2
(45) Date of Patent: Aug. 4, 2026

(54) BATTERY CONTROL DEVICE AND BATTERY SYSTEM

(71) Applicant: VEHICLE ENERGY JAPAN INC., Ibaraki (JP)

(72) Inventor: Hironori Sasaki, Ibaraki (JP)

(73) Assignee: VEHICLE ENERGY JAPAN INC., Ibaraki (JP)

( * ) Notice: Subject to any disclaimer, the term of this patent is extended or adjusted under 35 U.S.C. 154(b) by 515 days.

(21) Appl. No.: 18/034,973

(22) PCT Filed: Dec. 22, 2021

(86) PCT No.: PCT/JP2021/047651
§ 371 (c)(1),
(2) Date: May 2, 2023

(87) PCT Pub. No.: WO2022/138745
PCT Pub. Date: Jun. 30, 2022

(65) Prior Publication Data
US 2023/0402670 A1 Dec. 14, 2023

(30) Foreign Application Priority Data
Dec. 22, 2020 (JP) ................................. 2020-212976

(51) Int. Cl.
*H01M 10/48* (2006.01)
*G01R 31/367* (2019.01)
(Continued)

(52) U.S. Cl.
CPC ........ *H01M 10/486* (2013.01); *G01R 31/367* (2019.01); *G01R 31/387* (2019.01); *G01R 31/392* (2019.01); *H01M 10/443* (2013.01)

(58) Field of Classification Search
CPC ............. H01M 10/486; H01M 10/443; H01M 10/425; H01M 2220/20; G01R 31/367;
(Continued)

(56) References Cited

U.S. PATENT DOCUMENTS

| 2005/0225177 A1* | 10/2005 | Jacobs | ...................... G06F 1/26 |
| | | | 307/82 |
| 2012/0086368 A1* | 4/2012 | Kawabuchi | ............. B60L 58/24 |
| | | | 320/134 |

(Continued)

FOREIGN PATENT DOCUMENTS

| JP | 2011-061947 A | 3/2011 |
| JP | 2012-085452 A | 4/2012 |

(Continued)

OTHER PUBLICATIONS

Patent Cooperation Treaty, International Search Report, Application No. PCT/JP2021/047651, dated Mar. 15, 2022, in 4 pages.

*Primary Examiner* — Lal Ce Mang
(74) *Attorney, Agent, or Firm* — Procopio, Cory, Hargreaves & Savitch LLP

(57) ABSTRACT

A battery control device (an assembled battery control unit 150) has a degraded battery state estimation unit 521, a storage unit 180, and an upper limit voltage estimation unit 1522. The degraded battery state estimation unit 521 estimates a first degraded state of a battery on the basis of at least any one of a use history, a capacity retention rate, and an internal resistance increase rate of the battery and estimates a second degraded state of constituent elements inside the battery with respect to each type of the battery. The storage unit 180 stores information regarding an upper limit voltage of chargeable electric power with respect to each temperature of the battery. The upper limit voltage estimation unit estimates the upper limit voltage of the chargeable electric power of the battery on the basis of the above-
(Continued)

described information. The upper limit voltage estimation unit 1522 updates the above-described information on the basis of the first degraded state and the second degraded state.

16 Claims, 6 Drawing Sheets

(51) Int. Cl.
    *G01R 31/387*        (2019.01)
    *G01R 31/392*        (2019.01)
    *H01M 10/44*         (2006.01)
(58) Field of Classification Search
    CPC ..... G01R 31/387; G01R 31/392; H02J 7/005;
                          H02J 7/007182; H02J 7/007194
    See application file for complete search history.

(56)                References Cited

U.S. PATENT DOCUMENTS

| | | | | |
|---|---|---|---|---|
| 2016/0351974 A1* | 12/2016 | Oniki | ................... | G01R 31/382 |
| 2017/0330070 A1* | 11/2017 | Sengupta | ................. | G06N 3/04 |
| 2018/0053971 A1* | 2/2018 | Matsui | ................. | H01M 10/44 |
| 2019/0317149 A1* | 10/2019 | Tachibana | ........... | H01M 10/482 |
| 2022/0131400 A1 | 4/2022 | Nakao et al. | | |

FOREIGN PATENT DOCUMENTS

| | | | | | |
|---|---|---|---|---|---|
| JP | 2017117755 A | * | 6/2017 | ............. | G01R 31/36 |
| WO | WO-2013133017 A1 | * | 9/2013 | ............ | H01M 10/44 |
| WO | WO2020158182 A1 | | 8/2020 | | |

* cited by examiner

BATTERY CONTROL DEVICE AND BATTERY SYSTEM

CROSS-REFERENCE TO RELATED APPLICATIONS

This application is US National Stage of International Patent Application PCT/JP2021/047651, filed Dec. 22, 2021, which claims benefit of priority from Japanese Patent Application JP2020-212976, filed Dec. 22, 2020, the contents of both of which are incorporated herein by reference.

TECHNICAL FIELD

The present invention relates to a battery control device and a battery system.

BACKGROUND ART

A battery system which is mounted in, for example, an electric vehicle (EV: Electric Vehicle), a plug-in hybrid electric vehicle (PHEV: Plug-in Hybrid Electric Vehicle), a hybrid electric vehicle (HEV: Hybrid Electric Vehicle), etc. is generally configured from a plurality of secondary batteries which are connected serially or parallelly, and various electric components. The electric components include a relay for performing on/off control by electrically connecting the secondary batteries and current loads, sensors for measuring electric currents and voltages of the secondary batteries, and a battery control device for controlling electric charging/discharging of the second batteries, and so on.

The battery control device sets a limiting value to the voltage(s) of the secondary battery/batteries to use the secondary battery/batteries within an appropriate range and control the electric charging/discharging of the secondary battery/batteries within the limited voltage range. The above-described control prevents overcharging or overdischarging of the secondary batteries and suppresses degradation of the secondary batteries.

For example, a technology described in PTL 1 is known regarding a method for controlling an upper limit voltage of secondary batteries. In PTL 1, a moving average of the voltage is calculated for each average time, an upper limit voltage is set for each average time mentioned above on the basis of an upper limit voltage map, which is formed of an upper limit voltage which is predetermined for each moving average time and a temperature, and a minimum value of the upper limit voltage which is set for each average time is set as the upper limit voltage.

CITATION LIST

Patent Literature

PTL 1: WO2020/158182

SUMMARY OF THE INVENTION

Problems To Be Solved By The Invention

It is desirable that the upper limit voltage be set appropriately according to a degraded state inside the relevant battery.

Means to Solve the Problems

In order to solve the above-described problem of the conventional technology, there is provided a battery control device according to the present invention including: a degraded battery state estimation unit that estimates a first degraded state of a battery on the basis of at least any one of a use history, a capacity retention rate, and an internal resistance increase rate of the battery and estimates a second degraded state of constituent elements inside the battery regarding each type of the battery; a storage unit that stores information regarding an upper limit voltage of chargeable electric power with respect to each temperature of the battery; and an upper limit voltage estimation unit that estimates the upper limit voltage of the chargeable electric power of the battery on the basis of the information, wherein the upper limit voltage estimation unit updates the information on the basis of the first degraded state and the second degraded state.

Advantageous Effects of the Invention

According to the present invention, charging performance of the secondary batteries can be exhibited safely and to the maximum by variably controlling the upper limit voltage according to the degraded state of the secondary batteries.

BRIEF DESCRIPTION OF DRAWINGS

FIG. 1 is a functional block diagram of a battery system according to an embodiment;

FIG. 3 is a functional block diagram of an assembled battery control unit according to the embodiment;

DESCRIPTION OF EMBODIMENTS

Figure 2:
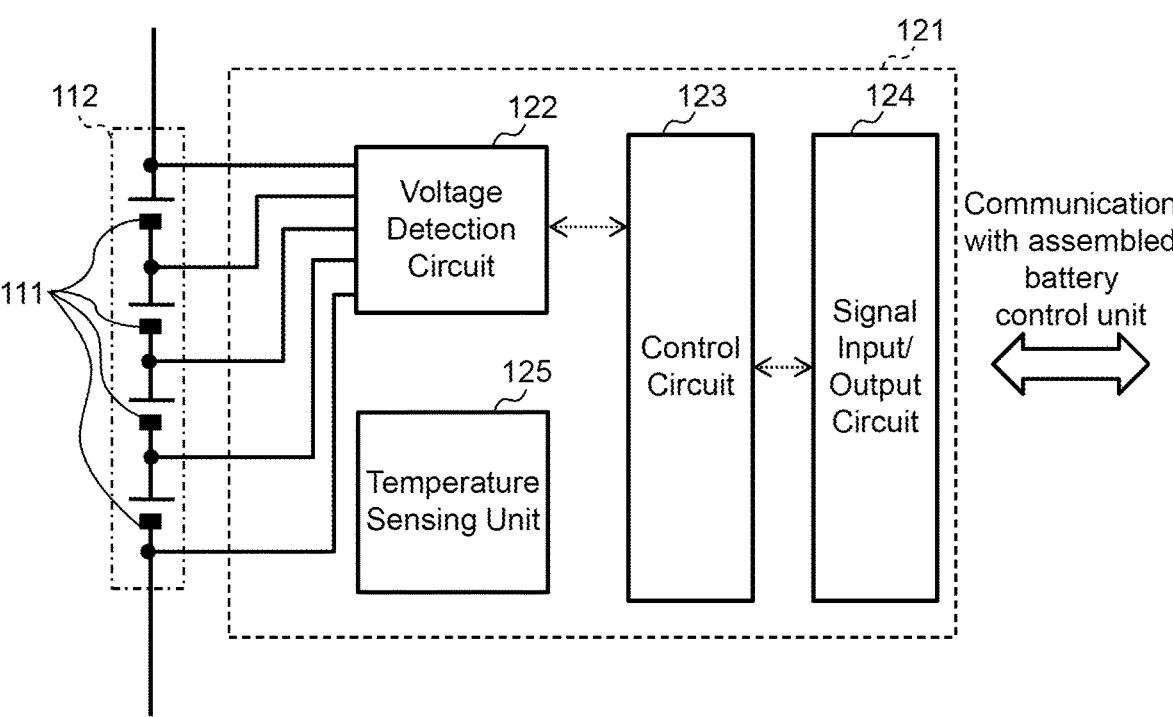
FIG. 2 is a functional block diagram of a single battery control unit according to the embodiment.

An embodiment of the present invention will be explained below with reference to the drawings. Regarding the following embodiment, an explanation will be provided about a case where the present invention is applied to a battery system which configures a power source for hybrid vehicles. However, the configuration of the embodiment explained below is not limited to this example and the present invention can be also applied to a capacitor control circuit for an electric storage apparatus which configures a power source for passenger cars such as plug-in hybrid vehicles and electric vehicles or industrial vehicles such as hybrid trucks.

Moreover, in the embodiment described below, an explanation will be provided by taking an example of a case where a lithium-ion battery is adopted; however, the present invention can be also used for, for example, a lead battery, a nickel-hydrogen battery, or a polyvalent cation battery as long as it is a secondary battery capable of electric charging/ discharging. Furthermore, in the embodiment described below, a plurality of single batteries are connected serially to configure an assembled battery; however, the present invention can be also provided to: a system configured from an assembled battery where sets of single batteries, which are connected parallelly in each set, are connected serially; and a system configured from an assembled battery where sets of single batteries, which are connected serially in each set, are connected parallelly.

Figure 1:
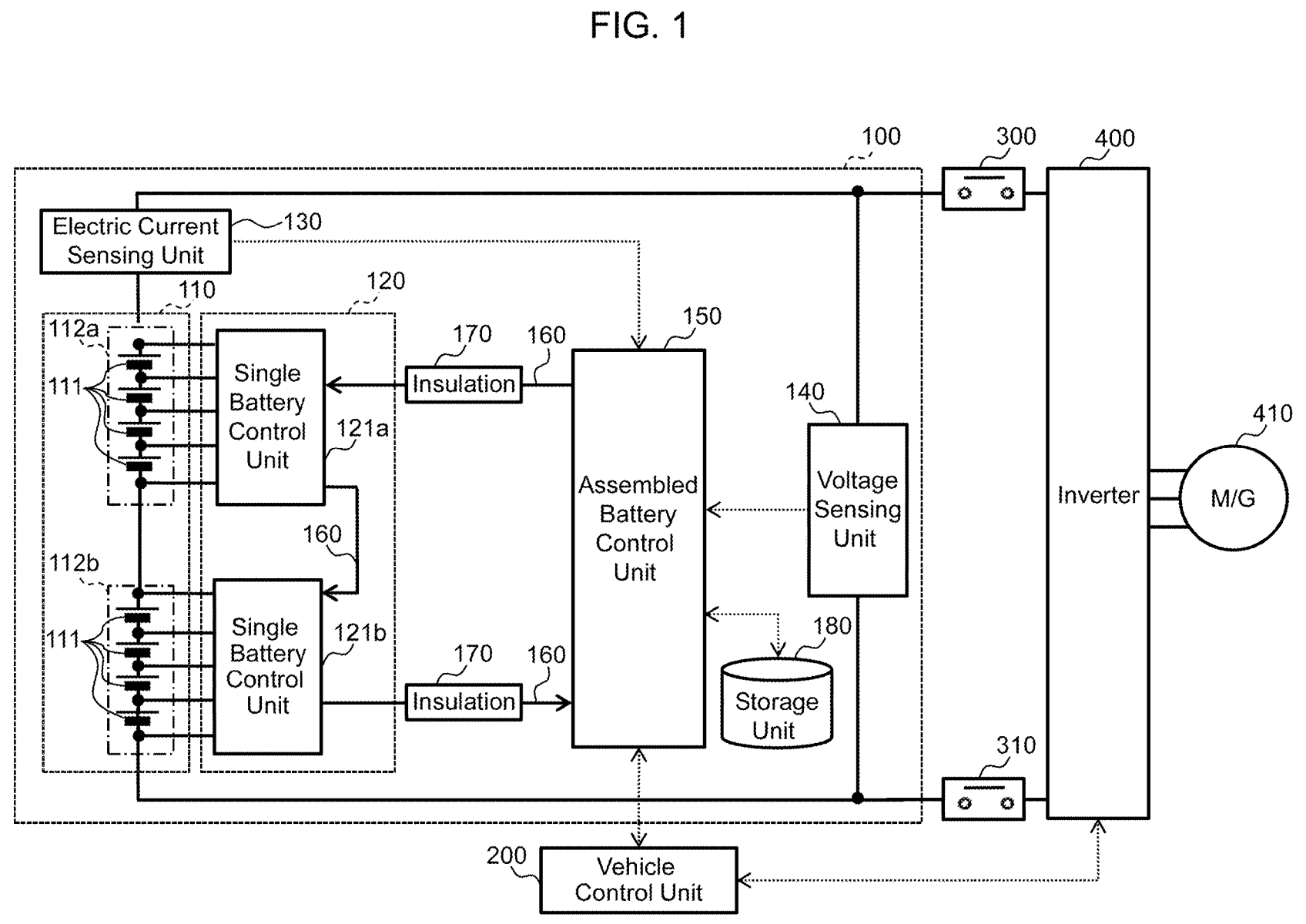

FIG. 1 is a functional block diagram of a battery system 100 according to an embodiment. The battery system 100 is connected to an inverter 400 via relays 300, 310. The battery system 100 is configured by including an assembled battery 110, a single battery management unit 120, an electric current sensing unit 130, a voltage sensing unit 140, an assembled battery control unit 150, and a storage unit 180.

The assembled battery 110 is configured from a plurality of single batteries 111. The single battery management unit 120 monitors the status of the single batteries 111. The electric current sensing unit 130 detects an electric current flowing through the battery system 100. The voltage sensing unit 140 detects a total voltage of the assembled battery 110. The assembled battery control unit 150 detects the status of the assembled battery 110 and also, for example, manages the status.

The assembled battery 110 is configured by electrically serially connecting the plurality of single batteries 111 capable of accumulating and discharging electric energy (electric charging/discharging of direct-current power). For example, a lithium-ion battery whose output voltage is 3.0 to 4.2 V (average output voltage: 3.6 V) is used as each single battery 111. Incidentally, batteries with voltage specifications other than the above may also be used.

The single batteries 111 which constitute the assembled battery 110 are formed into a specified unit number of groups in order to manage and control the status. The grouped single batteries 111 are electrically serially connected and form single battery groups 112a, 112b. The number of single batteries 111 which configure a single battery group 112 may be the same number with regard to all the single battery groups 112 or the number of single batteries 111 may vary for the respective single battery groups 112.

The single battery management unit 120 monitors the status of the single batteries 111 which configure the assembled battery 110. The single battery management unit 120 includes single battery control units 121, each of which is provided for each single battery group 112. In FIG. 1, single battery control units 121a and 121b are provided corresponding to the single battery groups 112a and 112b, respectively. The single battery control unit 121 monitors and controls the status of the single batteries 111 which configure the single battery group 112.

This embodiment is configured for simplification of explanation so that four single batteries 111 are electrically serially connected to configure the single battery groups 112a and 112b and the single battery groups 112a and 112b are further electrically serially connected to form the assembled battery 110 including a total of eight single batteries 111.

The assembled battery control unit 150 receives inputs of, for example, measured values of battery voltages and temperatures of the single batteries 111, which are output from the single battery management unit 120, an electric current value from the electric current sensing unit 130, a total voltage value of the assembled battery 110, which is output from the voltage sensing unit 140, and battery characteristic information of the single batteries 111, which is stored in the storage unit 180.

Furthermore, the single battery management unit 120 has a function that performs diagnosis to check whether the single batteries 111 is overcharged or overdischarged, and a function that outputs an anomaly signal when, for example, a communication error has occurred at the single battery management unit 120; and these diagnosis results and the anomaly signal are also input to the assembled battery control unit 150. Furthermore, a signal is also input from a vehicle control unit 200 which is a host control apparatus.

The assembled battery control unit 150 performs computation to appropriately control the electric charging/discharging of the assembled battery 110 on the basis of the input information, an electric current limiting value stored in the storage unit 180 in advance, and battery characteristics of the single batteries 111. For example, the assembled battery control unit 150 executes, for example, computation of an electric power limiting value for the electric charging/discharging of the respective single batteries 111, computation of a state of charge (SOC: State Of Charge) and a degraded state (internal resistance increase rate (SOHR (State Of Health based on Resistance)), and a capacity retention rate (SOHC (State Of Health based on Capacity))) of each single battery 111, and computation to perform voltage equalization control of each single battery 111. The assembled battery control unit 150 outputs the results of these computations and commands based on the computation results to the single battery management unit 120 and the vehicle control unit 200.

The storage unit 180 stores information about the battery characteristics of the assembled battery 110, the single batteries 111, and the single battery groups 112. Incidentally, this embodiment is configured so that the storage unit 180 is installed outside the assembled battery control unit 150 or the single battery management unit 120; however, it may be configured so that the assembled battery control unit 150 or the single battery management unit 120 includes a storage unit and the aforementioned information may be stored in this storage unit.

Moreover, the storage unit 180 stores, as information, a vehicle driving history composed of a map obtained by combining a current load upon the electric charging/discharging of the assembled battery, or electric power load information and a temperature at that time, and the SOC with stay time, and a vehicle stop history composed of a map obtained by combining the temperature and the SOC when the vehicle stops, with the stay time.

The assembled battery control unit 150 and the single battery management unit 120 transmit/receive signals via insulation elements 170, which are represented by photo-couplers, and signal communication means 160. The insulation elements 170 are provided because the assembled battery control unit 150 and the single battery management unit 120 have different operating power sources. Specifically, while the single battery management unit 120 operates by receiving the electric power from the assembled battery 110, the assembled battery control unit 150 uses a battery for an in-vehicle auxiliary machine (such as a 14-V battery) as a power source. The insulation element 170 may be mounted on a circuit board which configures the single battery management unit 120 or may be mounted on a circuit board which configures the assembled battery control unit 150. The insulation elements 170 can be omitted depending on the system configuration.

An explanation will be provided about a communication means between the assembled battery control unit 150 and the single battery control units 121a and 121b which constitute the single battery management unit 120. The single battery control units 121a and 121b are connected serially in descending order of electric potentials of the single battery groups 112a and 112b which they monitor respectively.

The signal transmitted by the assembled battery control unit 150 to the single battery management unit 120 is input to the single battery control unit 121*a* via the insulation element 170 and a signal communication means 160. The output from the single battery control unit 121*a* is input to the single battery control unit 121*b* via the signal communication means 160 and the output from the single battery control unit 121*b* at the lowest rank is transmitted to the assembled battery control unit 150 via the insulation element 170 and the signal communication means 160.

In this embodiment, the insulation element 170 is not interposed between the single battery control unit 121*a* and the single battery control unit 121*b*, however, the single battery control unit 121*a* and the single battery control unit 121*b* can send/receive a signal via the insulation element 170.

The vehicle control unit 200 controls the inverter 400 which is connected to the battery system via the relays 300 and 310, by using the information transmitted by the assembled battery control unit 150. While a vehicle is traveling, the battery system 100 is connected to the inverter 400 and drives a motor generator 410 by using energy accumulated by the assembled battery 110.

When a vehicle system equipped with the battery system 100 starts and then the vehicle travels, the battery system 100 under the management of the vehicle control unit 200 is connected to the inverter 400 and drives the motor generator 410 by using the energy stored in the assembled battery 110; and upon regeneration, the assembled battery 110 is charged with the electric power generated by the motor generator 410. The energy stored in the assembled battery 110 by the electric charging is used when the vehicle travels next time or is also used to cause electrical equipment or the like inside and outside the vehicle to operate.

FIG. 2 is a functional block diagram of the single battery control unit 121 according to the embodiment. The single battery control unit 121 is configured by including a voltage detection circuit 122, a control circuit 123, a signal input/output circuit 124, and a temperature sensing unit 125. The voltage detection circuit 122 measures a voltage between terminals of each single battery 111. The control circuit 123 receives the measurement results from the voltage detection circuit 122 and the temperature sensing unit 125 and transmits them to the assembled battery control unit 150 via the signal input/output circuit 124. Incidentally, a circuit configuration which is commonly mounted in the single battery control unit 121 and equalizes variations of the voltage and the SOC among the single batteries 111, which occur in association with, for example, electric self-discharging and variations of the consumed electric current is recognized as being well known, so that a description of such circuit configuration is omitted.

The temperature sensing unit 125 included in the single battery control unit 121 in FIG. 2 has a function that measures a temperature of the single battery group 112. The temperature sensing unit 125 measures one temperature regarding the entire single battery group 112 and treats that temperature as a representative temperature value of the single batteries 111 which constitute the single battery group 112. The temperature measured by the temperature sensing unit 125 is used for various kinds of computations to detect the status of the single batteries 111, the single battery groups 112, or the assembled battery 110. Since FIG. 2 is based on this premise, the single battery control unit 121 is provided with one temperature sensing unit 125. The temperature sensing unit 125 can be provided for every single battery 111 to measure the temperature of each single battery

111 and it is thereby possible to execute various kinds of computations based on the temperatures of the respective single batteries 111; however, in this case, the number of the temperature sensing units 125 becomes large, so that the configuration of the single battery control unit 121 becomes complicated.

FIG. 2 illustrates the temperature sensing unit 125 in a simplified manner. Practically, a temperature sensor is installed at a temperature measurement object, the installed temperature sensor outputs temperature information as a voltage, the result of this measurement is transmitted via the control circuit 123 to the signal input/output circuit 124, and the signal input/output circuit 124 outputs the measurement result outside the single battery control unit 121. The single battery control unit 121 is equipped with a function implementing this sequence of flow as the temperature sensing unit 125 and the voltage detection circuit 122 can be also used to measure the temperature information (voltage).

Figure 3:
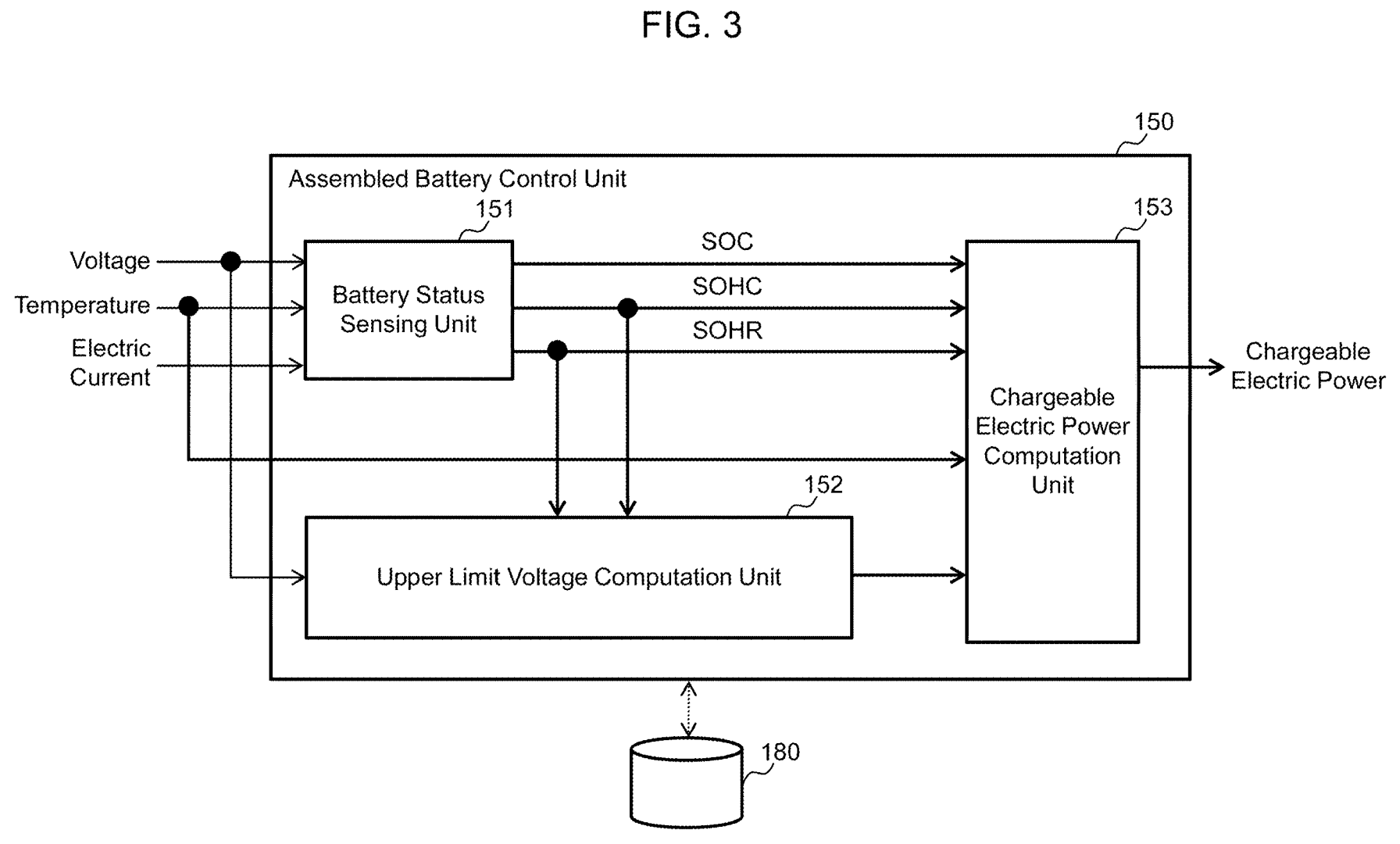

FIG. 3 is a functional block diagram of the assembled battery control unit 150 according to the embodiment. The assembled battery control unit 150 is the part that serves the function corresponding to a battery control device. The assembled battery control unit 150 is the part that decides the status of each single battery 111 in the assembled battery 110 and the electric power which can be input to, or output from, each single battery 111 on the basis of the temperature, the electric current value, and the voltage value of each single battery 111, which are detected while the vehicle is traveling. The assembled battery control unit 150 has, as its one functional constituent element, a function that performs computation of chargeable electric power (a charging electric power limiting value) to limit the electric power to charge each single battery 111.

Incidentally, the assembled battery control unit 150 has, other than the function that computes the chargeable electric power, various kinds of functions required to control the assembled battery 110 such as a function that controls electric discharging of each single battery 111 and a function that performs the voltage equalization control of each single battery 111; however, these are well-known functions and also not directly relevant to the present invention, so that any detailed explanation about them is hereinafter omitted.

Referring to FIG. 3, the assembled battery control unit 150 has, as its functions, the respective functional blocks of a battery status sensing unit 151, an upper limit voltage computation unit 152, and a chargeable electric power computation unit 153. The assembled battery control unit 150 computes the chargeable electric power of each single battery 111 on the basis of the electric current of the assembled battery 110 which is detected by the electric current sensing unit 130, and the voltage and the temperature of the assembled battery 110 which are detected by the voltage sensing unit 140, by means of these functional blocks.

Incidentally, the above explanation has been provided to describe that the assembled battery control unit 150 computes the chargeable electric power of the assembled battery 110; however, the chargeable electric power of the plurality of single batteries 111 may be collectively calculated. For example, the chargeable electric power can be calculated for each single battery group 112*a*, 112*b* or can be calculated based on the voltage of each single battery 111 which is detected by the single battery management unit 120. In these cases as well, the chargeable electric power can be calculated by the processing similar to that of the assembled battery 110. Moreover, the chargeable electric power of each single battery 111 can be calculated by the similar processing. Therefore, the function of the assembled battery control unit 150 that computes the chargeable electric power will be explained below by referring to a calculation object of the chargeable electric power simply as a "battery."

The battery status sensing unit 151 computes the SOC, the SOHC, and the SOHR of the battery on the basis of the electric current, the voltage, and the temperature of the battery which are input to the assembled battery control unit 150. Incidentally, a method for computing the SOC, the SOHC, and the SOHR is recognized as being publicly known, so that any explanation about it is omitted.

The upper limit voltage computation unit 152 receives inputs of chronological data of the voltage and the temperature of the battery, and the SOHC and the SOHR and computes a voltage history of the battery on the basis of the above-described input data. Then, the upper limit voltage computation unit 152 computes and outputs the upper limit voltage of the chargeable electric power of the battery on the basis of the voltage history of the battery. Incidentally, a specific method executed by the upper limit voltage computation unit 152 for computing the upper limit voltage will be described later.

The chargeable electric power computation unit 153 computes and output the chargeable electric power of the battery on the basis of the SOC, the SOHC, and the SOHR of the battery, which are computed by the battery status sensing unit 151, the temperature of the battery which is input to the assembled battery control unit 150, and the upper limit voltage of the battery which is computed by the upper limit voltage computation unit 152. Under this circumstance, the chargeable electric power is computed by a product of the chargeable electric current, which can be caused to flow through the battery during charging, and the voltage of the battery when the chargeable electric current is applied. The chargeable electric current can be calculated as an electric current value that is either a value of the electric current value which can be applied until the voltage of the battery reaches the upper limit voltage, or an electric current limiting value which is determined by constituent members (such as relays, a fuse, etc.) which configure the battery system 100, whichever is smaller.

Subsequently, an explanation will be provided about a specific method executed by the upper limit voltage computation unit 152 for computing the upper limit voltage with reference to FIG. 4 to FIG. 7.

Figure 4:
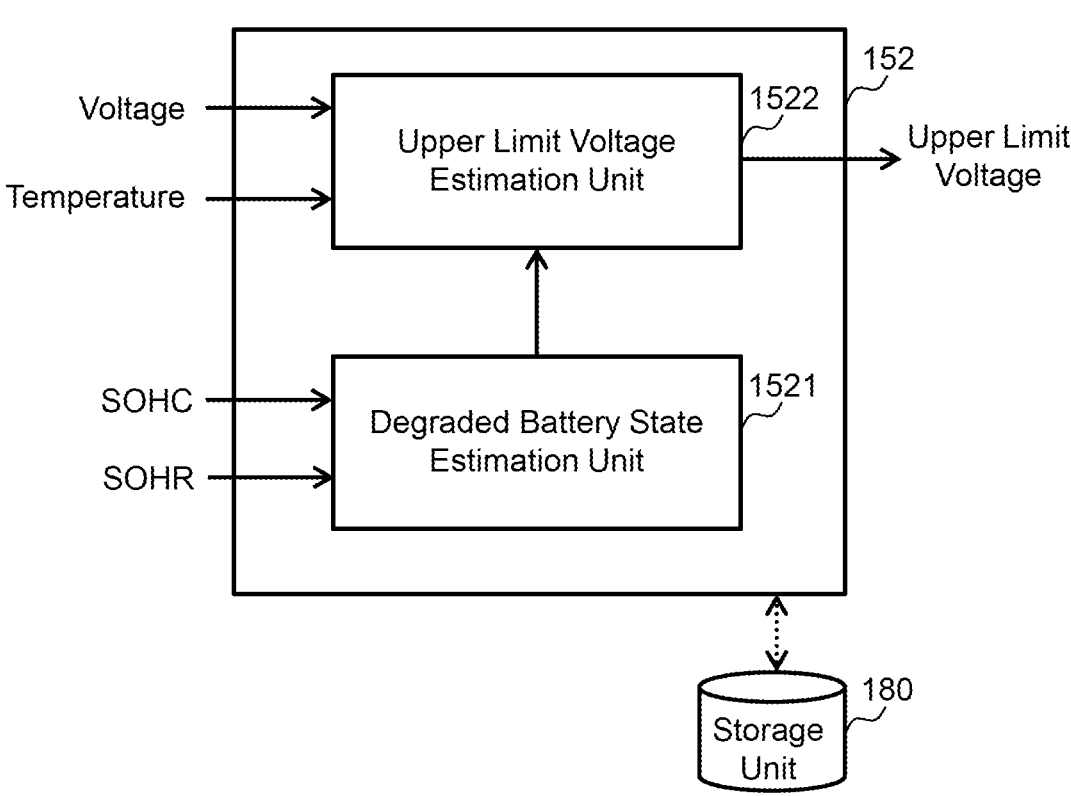
FIG. 4 is a functional block diagram of an upper limit voltage computation unit according to the embodiment.

FIG. 4 is a functional block diagram of the upper limit voltage computation unit 152 according to the embodiment. In this embodiment, the upper limit voltage computation unit 152 is configured by including a degraded battery state estimation unit 1521 and an upper limit voltage estimation unit 1522.

The degraded battery state estimation unit 1521 estimates the degraded state of the battery from the SOHC, the SOHR, and the vehicle driving history and the vehicle stop history, which are stored in the storage unit 180, and computes a ratio α to update an upper limit voltage map M. The upper limit voltage map M indicates the range of the upper limit voltage of the chargeable electric power of each single battery 111 capable of suppressing Li precipitation. The upper limit voltage map M will be explained later.

The upper limit voltage estimation unit 1522 updates upper limit voltage map M on the basis of the ratio α to update the upper limit voltage map M computed by the degraded battery state estimation unit 1521 with respect to the upper limit voltage map M including the information of the temperature and the upper limit voltage which are stored in the storage unit 180.

Specifically speaking, the upper limit voltage estimation unit 1522 updates a threshold value V_th for judging whether the upper limit voltage V with respect to each temperature T stored in the upper limit voltage map M is an upper limit voltage capable of suppressing the Li precipitation of the single battery 111 or not, by multiplying it by the ratio α computed by the degraded battery state estimation unit 1521 and updates the upper limit voltage map M with the updated threshold value V_th.

The upper limit voltage estimation unit 1522 refers to the updated upper limit voltage map M and estimates the upper limit voltage of the battery according to the temperature.

Figure 5:
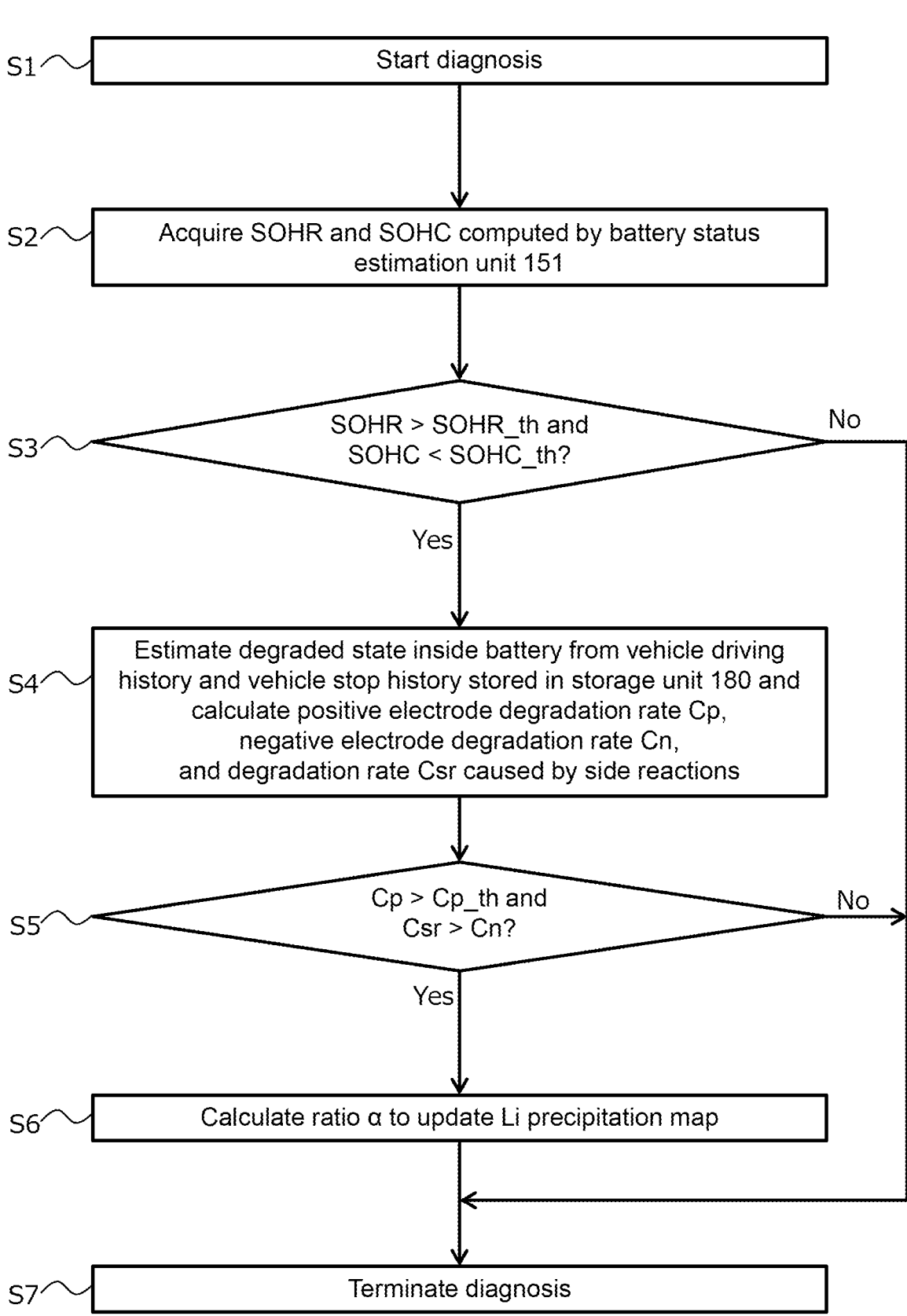
FIG. 5 a flowchart illustrating diagnosis processing by a degraded battery state estimation unit according to the embodiment.

FIG. 5 is a flowchart illustrating diagnosis processing by the degraded battery state estimation unit 1521 according to the embodiment. In step S1, the degraded battery state estimation unit 1521 starts the diagnosis of the degraded state of the battery after receiving a signal upon activation of the vehicle from, for example, the vehicle control unit 200.

Then, in step S2, the degraded battery state estimation unit 1521 acquires the SOHR and the SOHC computed by the battery status sensing unit 151. Under this circumstance, only the SOHR may be acquired and the SOHC which is indirectly calculated from the correlation between the SOHR and the SOHC may be used. Alternatively, only the SOHC may be acquire and the SOHR which is indirectly calculated from the correlation between the SOHR and the SOHC may be used.

Next, in step S3, the degraded battery state estimation unit 1521 compares the SOHR and the SOHC, which are acquired by the battery status sensing unit 151, with a threshold value SOHR_th and a threshold value SOHC_th, respectively. Then, if the SOHR is higher than the threshold value SOHR_th and the SOHC is lower than the threshold value SOHC_th (Yes in step S3 (when the battery is in the degraded state)), the degraded battery state estimation unit 1521 proceeds to the processing in step S4; and otherwise (No in step S3 (when the battery is not in the degraded state)), the degraded battery state estimation unit 1521 proceeds to the processing in step S7 and then terminates this diagnosis processing.

Incidentally, in step S3, the degraded battery state estimation unit 1521 may only compare the SOHC with the threshold value SOHC_th without limitation to the comparison between the SOHR and SOHC values and the threshold value SOHR_th and the threshold value SOHC_th. In this case, if the SOHC is lower than the threshold value SOHC_th (Yes in step S3), the degraded battery state estimation unit 1521 proceeds to the processing in step S4; and otherwise (No in step S3), the degraded battery state estimation unit 1521 proceeds to the processing in step S7.

Furthermore, in step S3, the degraded battery state estimation unit 1521 may judge the degraded state of the battery on the basis of at least any one of the use history (or at least one of the vehicle driving history and the vehicle stop history), the SOHR, and the SOHR of the battery which are stored in the storage unit 180.

In step S4, the degraded battery state estimation unit 1521 estimates the degraded state of the battery inside the battery from the vehicle driving history and the vehicle stop history, which are stored in the storage unit 180, on the basis of a life model of the battery system 100 and calculates a positive electrode degradation rate Cp, a negative electrode degradation rate Cn, and a degradation rate caused by side reactions Csr. Then, the degraded battery state estimation unit 1521 proceeds to the processing in step S5.

The life model defines a degradation rate of each constituent element inside the battery. The life model varies depending on the battery type; and, for example, in a case of a secondary battery, such as a lithium-ion battery, which uses an electrolyte, three degradation indexes, that is, the positive electrode degradation rate Cp, the negative electrode degradation rate Cn, and the degradation rate caused by the side reactions Csr are defined by the life model. The positive electrode degradation rate Cp: represents the degradation status of a positive electrode of the battery since the battery was a new product; and indicates a positive electrode capacity at the time point of the relevant degradation rate. The negative electrode degradation rate Cn: represents the degradation status of a negative electrode of the battery since the battery was the new product; and indicates a negative electrode capacity at the time point of the relevant degradation rate. The degradation rate caused by the side reactions Csr: represents a precipitation status of metal ions (lithium in this embodiment) in the electrolytic solution as caused by the side reactions of the battery since the battery was the new product; and indicates a lithium loss amount at the time point of the relevant degradation rate. The positive electrode degradation rate Cp, the negative electrode degradation rate Cn, and the degradation rate caused by the side reactions Csr are estimated by a specified calculation method from, for example, the status of use of the battery (such as a traveling time ratio and a stoppage time ratio relative to the entire time) which is estimated from the vehicle driving history and the vehicle stop history.

In step S5, the degraded battery state estimation unit 1521 compares each degradation rate calculated in step S4 with a threshold value for each degradation rate. Specifically speaking, if the positive electrode degradation rate Cp is higher than a threshold value Cp_th and the degradation rate caused by the side reactions Csr is higher than the negative electrode degradation rate Cn (Yes in step S5), the degraded battery state estimation unit 1521 proceeds to the processing in step S6; and otherwise (No in step S5), the degraded battery state estimation unit 1521 proceeds to the processing in step S7 and terminates the diagnosis processing.

In step S6, the degraded battery state estimation unit 1521 computes the ratio α to update the upper limit voltage map M from the negative electrode degradation rate Cn and the degradation rate caused by the side reactions Csr according to Expression (1) and transmits the computed value of the ratio α to the upper limit voltage estimation unit 1522. Then, the degraded battery state estimation unit 1521 proceeds to the processing in step S7 and terminates the diagnosis processing.

$$\alpha = k \times (Csr / Cn) \tag{1}$$

where k is a specified constant

Figure 6:
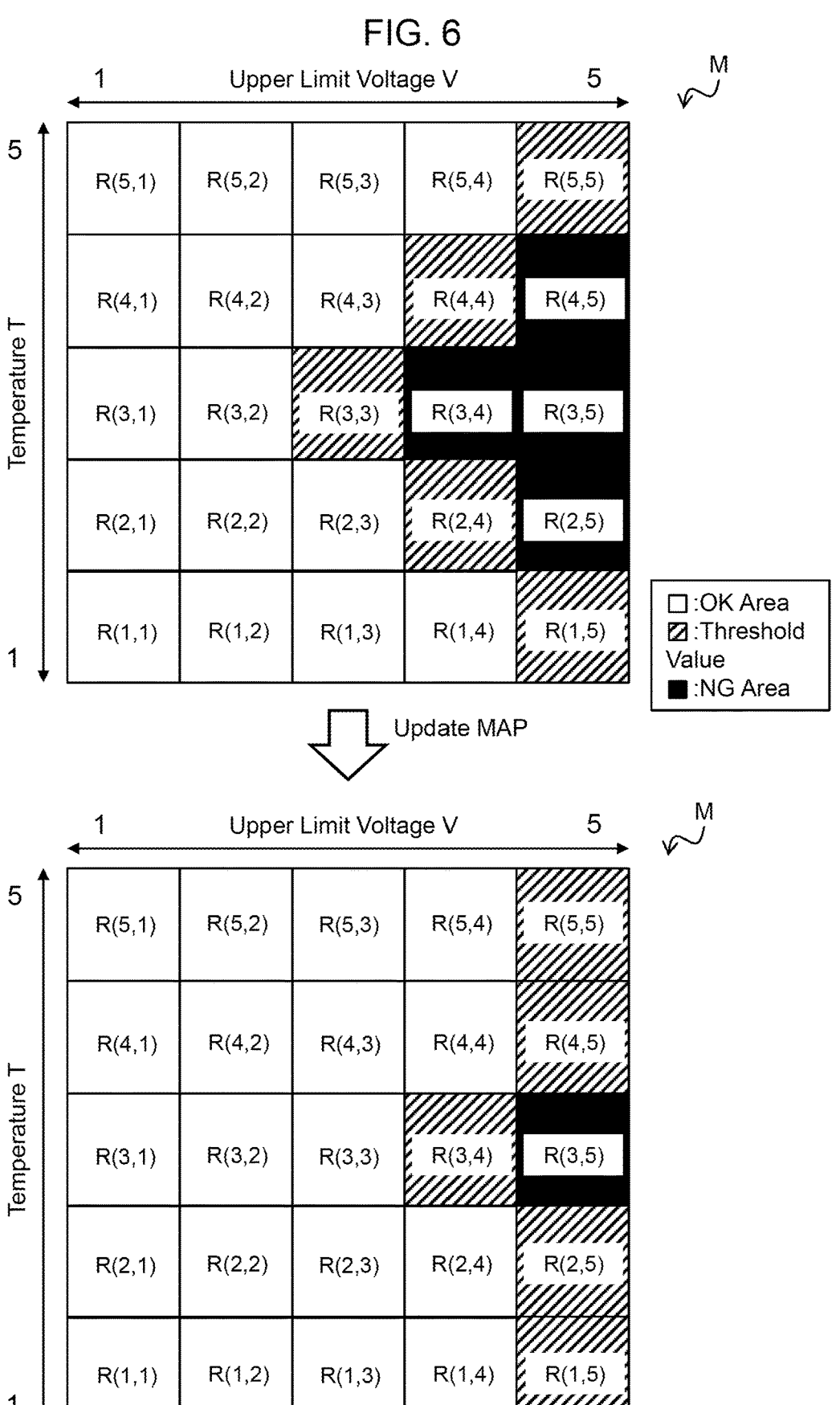
FIG. 6 is a diagram illustrating an upper limit voltage map and an update of the upper limit voltage map according to the embodiment.

FIG. 6 is a diagram illustrating the upper limit voltage map M and the update of the upper limit voltage map M according to the embodiment. In FIG. 6, for simplification of explanation, the upper limit voltage map M is expressed as a five-dimensional matrix of areas R(T, V) (T=1 to 5, V=1 to 5) corresponding to the temperature T and the upper limit voltage V where the horizontal axis represents upper limit voltages of V=1 through 5 and the vertical axis represents temperatures of T=1 through 5; however, granularity of the horizontal axis and the vertical axis may be more finer. FIG. 6 indicates that each area R(T, V) is any one of "OK," a "threshold value," and "NG."

When the area R(T, V) is "OK," it means that the relevant upper limit voltage V is lower than the threshold value V_th and the relevant area R(T, V) is a first area of the upper limit voltage capable of suppressing the precipitation of the metal ions in the electrolytic solution of the battery and capable of charging. When the area R(T, V) is the "threshold value," it means that the relevant upper limit voltage V is equal to the threshold value V_th and the relevant area R(T, V) is a threshold value area of the upper limit voltage capable of suppressing the precipitation of the metal ions in the electrolytic solution of the battery and capable of charging. When the area R(T, V) is "NG," it means that the relevant upper limit voltage V exceeds the threshold value V_th and the relevant area R(T, V) is a second area of the upper limit voltage which causes the precipitation of the metal ions in the electrolytic solution of the battery upon the electric charging. The first area and the second area are two divided parts of the upper limit voltage map M and are separated by the threshold value area as a boundary between them.

In the following explanation, a threshold value for the upper limit voltage V before the update is defined as V_th_1 and a threshold value of the upper limit voltage V after the update is defined as V_th_2.

As indicated in an upper diagram in FIG. 6, each upper limit voltage of areas R(1, 1), R(1, 2), R(1, 3), R(1, 4), R(2, 1), R(2, 2), R(2, 3), R(3, 1), R(3, 2), R(4, 1), R(4, 2), R(4, 3), R(5, 1), R(5, 2), R(5, 3), and R(5, 4) is lower than the threshold value V_th_1. Therefore, these upper limit voltages with respect to each temperature T are "OK" and the first area of the upper limit voltage of the battery is decided.

Moreover, as indicated in the upper diagram in FIG. 6, each upper limit voltage of areas R(1, 5), R(2, 4), R(3, 3), R(4, 4), and R(5, 5) is equal to the threshold value V_th_1. Therefore, each of these upper limit voltages with respect to each temperature T is the "threshold value" and the threshold value area of the upper limit voltage of the battery is decided.

Furthermore, as indicated in the upper diagram in FIG. 6, each upper limit voltage of areas R(2, 5), R(3, 4), R(3, 5), and R(4, 5) exceeds the threshold value V_th_1. Therefore, these upper limit voltages with respect to each temperature T are "NG" and the second area of the upper limit voltage of the battery is decided.

Next, the upper limit voltage estimation unit 1522 changes the threshold value V_th_1 of the upper limit voltage of each temperature T to the threshold value V_th_2 according to Expression (2) by using the ratio α decided by the diagnosis processing illustrated in FIG. 5.

$$V\_th\_2 = V\_th\_1 \times \alpha \tag{2}$$

For example, in a case of α>1, the result is V_th_2>V_th_1. The upper limit voltage estimation unit 1522 reevaluates each area R(T, V) with this updated threshold value V_th_2.

Then, as indicated in a lower diagram in FIG. 6, each upper limit voltage of the areas R(1, 1), R(1, 2), R(1, 3), R(1, 4), R(2, 1), R(2, 2), R(2, 3), R(2, 4), R(3, 1), R(3, 2), R(3, 3), R(4, 1), R(4, 2), R(4, 3), R(4, 4), R(5, 1), R(5, 2), R(5, 3), and R(5, 4) becomes lower than the threshold value V_th_2. Therefore, these upper limit voltages with respect to each temperature T are "OK" and the first area of the upper limit voltage of the battery has been thereby expanded.

Moreover, as indicated in the lower diagram in FIG. 6, each upper limit voltage of the areas R(1, 5), R(2, 5), R(3, 4), R(4, 5), and R(5, 5) is equal to the threshold value V_th_1. Therefore, each of these upper limit voltages with respect to each temperature T is the "threshold value" and the threshold value area of the upper limit voltage of the battery is decided.

Furthermore, as indicated in the lower diagram in FIG. 6, the upper limit voltage of the area R(3, 5) exceeds the threshold value V_th_2. Therefore, the upper limit voltage at the temperature T=3 is "NG" and the second area of the upper limit voltage of the battery has been thereby reduced.

Incidentally, in a case of α<1, the result is V_th_2<V_th_1. When the upper limit voltage of each area R(T, V) is reevaluated with this updated threshold value V_th_2, the first area is reduced and the second area is expanded.

Then, the upper limit voltage estimation unit 1522 estimates the upper limit voltage corresponding to the current temperature T of the battery from the first area of the updated upper limit voltage map M and sets the estimated upper limit voltage to the chargeable electric power computation unit 153.

As the threshold value V_th of the upper limit voltage is changed as described above, the range of the upper limit voltage of the battery in the upper limit voltage map M is increased or decreased.

Incidentally, the upper limit voltage map M described in the above-described embodiment is one example of the information which is associated with the range of the upper limit voltage of the battery relative to the temperature; however, it is not limited to the map and may be, for example, a table or a function.

According to the above-described embodiment, it is possible to perform the control to exhibit the charging property of the secondary battery safely and to the maximum by variably controlling the upper limit voltage according to the degraded state of the secondary battery.

In the aforementioned embodiment, the upper limit voltage of the chargeable electric power of the battery is variably controlled so that a larger amount of the electric power can be charged while preventing the precipitation of the metal ions in the electrolytic solution of the battery according to the degraded state inside the battery. When the upper limit voltage of the battery is higher, the metal ions tend to easily precipitate; however, the upper limit voltage which can prevent the precipitation of the metal ions varies depending on the degraded state inside the battery. By preventing the precipitation of the metal ions according to the degraded state inside the battery and making the upper limit voltage of the battery higher, the chargeable amount of electric power can be secured even if the degradation of the battery progresses; and it is possible to suppress a reduction of the amount of regenerative electric power and a reduction of fuel consumption of the vehicle equipped with the battery.

Furthermore, in the aforementioned embodiment, the upper limit voltage of the chargeable electric power of the battery is variably controlled on the basis of a first degraded state based on at least any one of the use history, the capacity retention rate, and the internal resistance increase rate of the battery, and a second degraded state of the constituent elements inside the battery with respect to each type of the battery based on the life model (the positive electrode degradation rate and the negative electrode degradation rate of the battery, and the degradation rate caused by the side reactions of the battery). The second degraded state is estimated from the vehicle driving history and the vehicle stop history which are stored in the storage unit 180. Therefore, the degree of degradation inside the battery, that is, the precipitation of the metal ions in the electrolytic solution of the battery can be estimated by simple processing by utilizing general data that is the use history, the capacity retention rate, and the internal resistance increase rate of the battery.

Furthermore, in the aforementioned embodiment, if at least the capacity retention rate, the positive electrode degradation rate, and the degradation rate caused by the side reactions satisfy specified conditions, an index value based on a quotient obtained by dividing the degradation rate caused by the side reactions of the electrolyte of the battery by the negative electrode degradation rate is calculated. Then, the information regarding the upper limit voltage of the chargeable electric power with respect to each temperature of the battery is updated based on this index value. Therefore, the information regarding the upper limit voltage of the chargeable electric power with respect to each temperature of the battery can be updated appropriately on the basis of the index for quantitatively recognizing the degradation status inside the battery and a more optimum upper limit voltage can be estimated, so that the performance of the battery can be utilized to the maximum over the lifespan of the battery.

Furthermore, in the aforementioned embodiment, the map indicating, with respect to each temperature of the battery, the first area of the upper limit voltage, which is capable of suppressing the precipitation of the metal ions in the electrolytic solution of the battery, the threshold value area which becomes the threshold value for the upper limit voltage capable of suppressing the precipitation of the metal ions, and the second area of the upper limit voltage incapable of suppressing the precipitation of the metal ions is updated to expand the first area and reduce the second area or to reduce the first area and expand the second area. Therefore, the upper limit voltage corresponding to the current temperature of the battery can be selected and set from the range defined by the first area and the threshold value area, so that the charging performance can be exhibited safely and to the maximum in consideration of suppressing the precipitation of the metal ions in the electrolytic solution of the battery.

Furthermore, in the aforementioned embodiment, the product of the voltage threshold value before the update and the index value based on the quotient obtained by dividing the degradation rate caused by the side reactions of the electrolyte of the battery by the negative electrode degradation rate is calculated as the second voltage threshold value after the update and the map of the upper limit voltage of the battery is updated based on the result of comparison between the second voltage threshold value and each upper limit voltage. Therefore, the map of the upper limit voltage of the battery can be updated according to the degraded state of the battery by means of simple processing.

Furthermore, in the aforementioned embodiment, the upper limit voltage of the battery is estimated and set on the basis of the information, which is updated according to the degradation status inside the battery, regarding the upper limit voltage of the chargeable electric power with respect to each temperature of the battery. Therefore, the upper limit voltage of the battery according to the degradation status inside the battery can be estimated and set by simple processing to refer to this information.

Furthermore, in the aforementioned embodiment, with the battery system having the battery control device and the assembled battery in which a plurality of batteries are connected to each other, the upper limit voltage of the battery according to the degradation status inside the battery can be estimated and set by simple processing to refer to the information, which is updated according to the degradation status inside the battery, regarding the upper limit voltage of the chargeable electric power with respect to each temperature of the battery.

The above description is merely an example and the present invention is not limited to the configuration of the aforementioned embodiment and includes various variations. For example, the aforementioned embodiment has been described in detail in order to explain the invention in an easily comprehensible manner and is not necessarily limited to those having all the configurations explained above. Furthermore, part of the configuration of a certain embodiment can be replaced with the configuration of another embodiment and the configuration of the other configuration can be added to part of the configuration of the certain embodiment. Furthermore, another configuration can be added to, deleted from, or replaced with part of the configuration of each embodiment. Furthermore, the respective steps in the processing of each embodiment may be executed by switching their sequential order as appropriate as long as the same result can be obtained.

REFERENCE SIGNS LIST

100: battery system
110: assembled battery
111: single battery
112, 112a, 112b: single battery group
120: single battery management unit
121: single battery control unit
121a, 121b: single battery control unit
122: voltage detection circuit
123: control circuit
124: signal input/output circuit
125: temperature sensing unit
130: electric current sensing unit
140: voltage sensing unit
150: assembled battery control unit (battery control device)
151: battery status sensing unit
152: upper limit voltage computation unit
153: chargeable electric power computation unit
180: storage unit
1521: degraded battery state estimation unit
1522: upper limit voltage estimation unit

The invention claimed is:

1. A battery control device configured to control charging of a lithium-ion battery in a vehicle battery system, the battery control device comprising:
  a degraded battery state estimation unit that estimates a first degraded state of a battery on a basis of at least any one of a use history, a capacity retention rate, and an internal resistance increase rate of the battery and estimates a second degraded state of constituent elements inside the battery regarding each type of the battery;
  a storage unit that stores information regarding an upper limit voltage of chargeable electric power with respect to each temperature of the battery based on a life model that defines degradation rates of constituent elements inside the battery, including positive electrode degradation rate, negative electrode degradation rate, and degradation rate caused by side reactions, where the life model is specific to the battery type and uses vehicle driving history and vehicle stop history stored in the storage unit; and
  an upper limit voltage estimation unit that estimates the upper limit voltage of the chargeable electric power of the battery on a basis of the information and prevents lithium precipitation by dynamically adjusting charging parameters based on updated information to maintain safe battery operation while maximizing charging performance, wherein the upper limit voltage estimation unit updates the information on a basis of the first degraded state and the second degraded state, and
wherein the upper limit voltage estimation unit generates control signals that are transmitted to charging circuitry to physically limit voltage applied to the battery during charging operations.

2. The battery control device according to claim 1,
wherein the first degraded state is expressed by the capacity retention rate and the internal resistance increase rate; and
wherein the second degraded state is expressed by a positive electrode degradation rate and a negative electrode degradation rate of the battery, and a degradation rate caused by side reactions of the battery.

3. The battery control device according to claim 2,
wherein if at least the capacity retention rate is smaller than a threshold value and the positive electrode degradation rate is larger than the threshold value, and the degradation rate caused by the side reactions is larger than the negative electrode degradation rate, the degraded battery state estimation unit calculates an index value based on a quotient obtained by dividing the degradation rate caused by the side reactions of an electrolyte of the battery by the negative electrode degradation rate and transmits the index value to the upper limit voltage estimation unit; and
wherein the upper limit voltage estimation unit updates the information on a basis of the index value.

4. The battery control device according to claim 1,
wherein the information is a map in which with respect to each temperature of the battery, an area associated with the upper limit voltage lower than a first voltage threshold value is set as a first area capable of suppressing precipitation of metal ions in an electrolytic solution of the battery, an area associated with the upper limit voltage in excess of the first voltage threshold value is set as a second area incapable of suppressing the precipitation of the metal ions, and an area associated with the upper limit voltage equal to the first voltage threshold value is set as a threshold value area capable of suppressing the precipitation of the metal ions; and
  wherein the upper limit voltage estimation unit updates the map to expand the first area and reduce the second area, or to reduce the first area and expand the second area.

5. The battery control device according to claim 4,
wherein the upper limit voltage estimation unit:
calculates, as a second voltage threshold value, a product of the first voltage threshold value and an index value based on quotient obtained by dividing the degradation rate caused by the side reactions of the electrolyte of the battery by the negative electrode degradation rate; and
updates the map so that in the map, with respect of each temperature of the battery, an area associated with the upper limit voltage lower than the second voltage threshold value is set as the first area which is new and capable of suppressing the precipitation of the metal ions, an area associated with the upper limit voltage in excess of the second voltage threshold value is set as the second area which is new and incapable of suppressing the precipitation of the metal ions, and an area associated with the upper limit voltage equal to the second voltage threshold value is set as the threshold value area which is new and capable of suppressing the precipitation of the metal ions.

6. The battery control device according to claim 1, wherein the upper limit voltage estimation unit estimates and sets the upper limit voltage of the chargeable electric power with respect to each temperature of the battery on a basis of the updated information.

7. The battery control device according to claim 1, comprising an assembled battery where the battery is provided in plurality and the plurality of batteries are connected to each other, wherein the battery control device sets the upper limit voltage of the chargeable electric power with respect to each temperature of the battery on a basis of the updated information and controls the batteries and the assembled battery.

8. The battery control device according to claim 1, wherein the degraded battery state estimation unit estimates the second degraded state based on a life model that defines degradation rates of constituent elements inside the battery, including positive electrode degradation rate, negative electrode degradation rate, and degradation rate caused by side reactions, where the life model is specific to the battery type and uses vehicle driving history and vehicle stop history stored in the storage unit, and wherein the upper limit voltage estimation unit prevents lithium precipitation by dynamically adjusting charging parameters based on the updated information to maintain safe battery operation while maximizing charging performance.

9. The battery control device according to claim 1, further comprising:

an assembled battery where the battery is provided in plurality and the plurality of batteries are connected to each other, wherein the upper limit voltage estimation unit estimates and sets the upper limit voltage of the chargeable electric power with respect to each temperature of the battery on a basis of the updated information, and wherein the battery control device controls charging of a lithium-ion battery in a vehicle battery system by preventing metal ion precipitation in an electrolytic solution while maximizing usable charging capacity through temperature-specific voltage adjustments.

10. The battery control device according to claim 1, wherein, when at least the capacity retention rate is smaller than a threshold value and the positive electrode degradation rate is larger than the threshold value, and the degradation rate caused by the side reactions is larger than the negative electrode degradation rate, the degraded battery state estimation unit calculates an index value based on a quotient obtained by dividing the degradation rate caused by the side reactions of an electrolyte of the battery by the negative electrode degradation rate and transmits the index value to the upper limit voltage estimation unit, wherein the upper limit voltage estimation unit updates the information on a basis of the index value, and wherein the information is a map in which with respect to each temperature of the battery, an area associated with the upper limit voltage lower than a first voltage threshold value is set as a first area capable of suppressing precipitation of metal ions in an electrolytic solution of the battery, an area associated with the upper limit voltage in excess of the first voltage threshold value is set as a second area incapable of suppressing the precipitation of the metal ions, and an area associated with the upper limit voltage equal to the first voltage threshold value is set as a threshold value area capable of suppressing the precipitation of the metal ions.

11. The battery control device according to claim 10, wherein the upper limit voltage estimation unit calculates, as a second voltage threshold value, a product of the first voltage threshold value and the index value based on the quotient obtained by dividing the degradation rate caused by the side reactions of the electrolyte of the battery by the negative electrode degradation rate, and wherein the upper limit voltage estimation unit updates the map so that in the map, with respect of each temperature of the battery, an area associated with the upper limit voltage lower than the second voltage threshold value is set as the first area which is new and capable of suppressing the precipitation of the metal ions, an area associated with the upper limit voltage in excess of the second voltage threshold value is set as the second area which is new and incapable of suppressing the precipitation of the metal ions, and an area associated with the upper limit voltage equal to the second voltage threshold value is set as the threshold value area which is new and capable of suppressing the precipitation of the metal ions, thereby expanding the first area and reducing the second area to exhibit charging performance safely and to a maximum in consideration of suppressing the precipitation of the metal ions in the electrolytic solution of the battery.

12. The battery control device according to claim 1, wherein the degraded battery state estimation unit estimates the second degraded state based on a life model that defines degradation rates of constituent elements inside the battery, including positive electrode degradation rate, negative electrode degradation rate, and degradation rate caused by side reactions, where the life model is specific to the battery type and uses vehicle driving history and vehicle stop history stored in the storage unit, wherein the upper limit voltage estimation unit estimates and sets the upper limit voltage of the chargeable electric power with respect to each temperature of the battery on a basis of the updated information according to a degradation status inside the battery, and wherein the upper limit voltage estimation unit variably controls the upper limit voltage of the chargeable electric power of the battery to prevent precipitation of metal ions in an electrolytic solution of the battery according to the degraded state inside the battery while making the upper limit voltage higher to secure chargeable amount of electric power even if degradation of the battery progresses.

13. The battery control device according to claim 1, wherein the upper limit voltage estimation unit calculates a ratio $\alpha$ based on formula $\alpha = k \times (Csr/Cn)$ where Csr is the degradation rate caused by side reactions, Cn is the negative electrode degradation rate, and k is a specified constant, and updates the information by multiplying a voltage threshold value by this ratio $\alpha$.

14. The battery control device according to claim 1, wherein the information stored in the storage unit is an upper limit voltage map that divides voltage ranges into first areas, threshold value areas, and second areas based on metal ion precipitation suppression capability, and the upper limit voltage estimation unit updates this map by changing threshold values to expand or reduce these areas based on the degraded states.

15. The battery control device according to claim 1, wherein the degraded battery state estimation unit performs diagnosis processing that compares SOHC with a threshold value SOHC_th and SOHR with a threshold value SOHC_th, and only proceeds to estimate the second degraded state when SOHC is lower than SOHC_th and SOHR is higher than SOHC_th, followed by comparing positive electrode degradation rate Cp with threshold Cp_th and confirming that degradation rate caused by side reactions Csr is higher than negative electrode degradation rate Cn before calculating a update ratio.

16. The battery control device according to claim 1, wherein the degraded battery state estimation unit uses a life model to calculate specific degradation rates including positive electrode degradation rate, negative electrode degradation rate, and side reaction degradation rate, and the upper limit voltage estimation unit updates a voltage threshold map by multiplying threshold values by a ratio calculated from these degradation rates to prevent metal ion precipitation during charging.

\* \* \* \* \*